United States Patent
Jung et al.

(10) Patent No.: US 7,612,392 B2
(45) Date of Patent: Nov. 3, 2009

(54) IMAGE SENSOR WITH A GATE ELECTRODE BETWEEN THE PHOTOELECTRIC CONVERSION REGION AND THE CHARGE DETECTION REGION, THE GATE ELECTRODE COMPRISING P-TYPE AND N-TYPE REGIONS ADJACENT TO ONE ANOTHER AND METHOD OF FABRICATING THE SAME

(75) Inventors: Sang-Il Jung, Seoul (KR); Duk-Min Yi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 140 days.

(21) Appl. No.: 11/528,409

(22) Filed: Sep. 28, 2006

(65) Prior Publication Data

US 2007/0075337 A1    Apr. 5, 2007

(30) Foreign Application Priority Data

Oct. 4, 2005    (KR) ...................... 10-2005-0093106

(51) Int. Cl.
*H01L 31/062* (2006.01)
*H01L 31/113* (2006.01)

(52) U.S. Cl. .................... 257/225; 257/222; 257/290; 257/414; 257/428; 257/431; 257/E31.037; 257/E31.032; 257/E31.039

(58) Field of Classification Search .......... 257/E21.623, 257/E21.637, 292, 229, 462, 461, 222, 431, 257/428, 414, 290, 225, E31.032, E31.037, 257/E31.039

See application file for complete search history.

(56) References Cited

U.S. PATENT DOCUMENTS

| 4,745,079 | A | * | 5/1988 | Pfiester | 438/306 |
| 5,753,952 | A | * | 5/1998 | Mehrad | 257/316 |
| 6,768,149 | B1 | * | 7/2004 | Mann et al. | 257/292 |
| 7,217,968 | B2 | * | 5/2007 | Adkisson et al. | 257/292 |
| 2003/0209743 | A1 | * | 11/2003 | Park | 257/290 |

(Continued)

FOREIGN PATENT DOCUMENTS

JP    2003-174156    6/2003

(Continued)

OTHER PUBLICATIONS

Office Action for corresponding Korean Application No. 10-2005-0093106 dated Sep. 29, 2006 *and English language translation thereof.*

*Primary Examiner*—Phat X Cao
*Assistant Examiner*—Diana C Garrity
(74) *Attorney, Agent, or Firm*—Harness, Dickey & Pierce, P.L.C.

(57) ABSTRACT

Example embodiments relate to an image sensor and a fabrication method thereof. An image sensor may include a semiconductor substrate. A charge transfer structure may be formed on the semiconductor substrate. The charge transfer structure may include a gate insulating film that may be formed on a channel region in the semiconductor substrate between a photoelectric conversion region and charge detection region, and a transfer gate electrode that may be formed on the gate insulating film that may have a region doped with a first conductivity type impurity-doped region and a second conductivity type impurity-doped region which may be adjacent to each other.

17 Claims, 7 Drawing Sheets

U.S. PATENT DOCUMENTS

2006/0180868 A1* 8/2006 Maciejewski et al. ....... 257/369
2007/0029587 A1* 2/2007 Greer et al. ................. 257/288

FOREIGN PATENT DOCUMENTS

| KR | 10-2003-0001110 | 1/2003 |
| KR | 2003-0001141 | 1/2003 |
| KR | 2003-0046924 | 6/2003 |
| KR | 10-2004-0008683 | 1/2004 |

* cited by examiner

IMAGE SENSOR WITH A GATE ELECTRODE BETWEEN THE PHOTOELECTRIC CONVERSION REGION AND THE CHARGE DETECTION REGION, THE GATE ELECTRODE COMPRISING P-TYPE AND N-TYPE REGIONS ADJACENT TO ONE ANOTHER AND METHOD OF FABRICATING THE SAME

PRIORITY STATEMENT

This U.S. non-provisional application is based on and claims priority under 35 U.S.C. §119 from Korean Patent Application No. 10-2005-0093106, filed on Oct. 4, 2005 in the Korean Intellectual Property Office (KIPO), the entire contents of which is incorporated herein by reference.

BACKGROUND

1. Field

Example, non-limiting embodiments relate to an image sensor, for example, to an image sensor having improved image reproduction characteristics.

2. Description of the Related Art

An image sensor is a device that may convert optical images to electrical signals. With the development of the computer and the communication industries, there may be an increasing demand for an image sensor having improved performance, for example, for use in digital cameras, camcorders, PCS's (Personal Communication Systems), gaming machines, security cameras, micro-cameras for medical applications, and/or robots.

The unit pixel of the image sensor may include a charge transfer structure that may transfer a signal charge, produced in a photoelectric conversion region, to a charge detection region.

However, on the surface of a semiconductor substrate constituting the image sensor, dangling bonds and the like may be produced if the surface is damaged during an ion implantation and/or etching process. In the region where such dangling bonds may be produced, thermally generated EHP's (electron-hole pairs) may be created. If these thermally generated EHP's are introduced into the photoelectric conversion region, they may cause white spots or dark currents, which may deteriorate the reproduction characteristics of the image sensor.

SUMMARY

Example embodiments may provide an image sensor, and fabrication method thereof, capable of having improved image reproduction characteristics, for example, reduction of white spots and/or dark currents.

In an example, non-limiting embodiment, an image sensor may include a semiconductor substrate. A charge transfer structure may be formed on the semiconductor substrate. The charge transfer structure may include a gate insulating film that may be formed on a channel region in the semiconductor substrate between a photoelectric conversion region and a charge detection region, and a transfer gate electrode that may be formed on the gate insulating film that may have a first conductivity type impurity-doped region and a second conductivity type impurity-doped region adjacent to each other.

According to an example, non-limiting embodiment, the first conductivity type impurity-doped region may be adjacent to the photoelectric conversion region and the second conductivity type impurity-doped region may be adjacent to the charge detection region.

According to an example, non-limiting embodiment, the first conductivity type impurity-doped region may be a p-type region, and the second conductivity type impurity-doped region may be an n-type region.

According to an example, non-limiting embodiment, the second conductivity type impurity-doped region may be formed on at least 50% of a width of the transfer gate electrode.

According to an example, non-limiting embodiment, a peak of a potential barrier that may be formed below the transfer gate electrode may be closer to the photoelectric conversion region than the charge detection region.

According to an example, non-limiting embodiment, the photoelectric conversion region may be a photodiode having a second conductivity type that may partially overlap the lower substrate region of the transfer gate electrode.

According to an example, non-limiting embodiment, the photoelectric conversion region may further include a pinning layer having a first conductivity type formed on the photodiode.

According to an example, non-limiting embodiment, the charge detection region may be a second conductivity type.

According to an example, non-limiting embodiment, the channel region may be a threshold voltage controlling impurity region.

According to an example, non-limiting embodiment, the charge transfer structure may transfer a charge accumulated in the photoelectric conversion region to a charge detection region.

According to an example, non-limiting embodiment, the transfer gate electrode may be a polysilicon film.

In an example, non-limiting embodiment, a method of fabricating an image sensor may involve providing a semiconductor substrate. A charge transfer structure may be formed on the semiconductor substrate. The charge structure may include a gate insulating film that may be formed on a channel region in the semiconductor substrate between a photoelectric conversion region and a charge detection region, and a transfer gate electrode may be formed on the gate insulating film that may have a first conductivity type impurity-doped region and a second conductivity type impurity-doped region formed that may be adjacent to each other.

According to an example, non-limiting embodiment, forming the transfer gate electrode may include forming the first conductivity type impurity-doped region adjacent to the photoelectric conversion region, and forming the second conductivity type impurity-doped region adjacent to the charge detection region.

According to an example, non-limiting embodiment, the first conductivity type impurity-doped region may be a p-type region, and the second conductivity type impurity-doped region may be an n-type region.

According to an example, non-limiting embodiment, forming the transfer gate electrode may include forming the second conductivity type impurity-doped region on at least 50% of a width of the transfer gate electrode.

According to an example, non-limiting embodiment, forming the transfer gate electrode may include forming the first conductivity type impurity-doped region and the second conductivity type impurity-doped region in the transfer gate electrode such that a peak of a potential barrier that may be formed below the transfer gate electrode may be closer to the photoelectric conversion region than the charge detection region.

According to an example, non-limiting embodiment, forming the charge transfer structure may include forming a transfer gate pattern on the gate insulating film; implanting a second conductivity type impurity into the semiconductor substrate adjacent to a first side of the transfer gate pattern to form a second conductivity type photodiode that may partially overlap a semiconductor substrate region beneath the transfer gate pattern; forming a first conductivity type pinning layer on the second conductivity type photodiode concurrently with a first conductivity type impurity-doped region that may be formed on the transfer gate pattern; and implanting the second conductivity type impurity into the semiconductor substrate adjacent to a second side of the transfer gate pattern to form the charge detection region concurrently with the second conductivity type impurity-doped region that may be formed on the transfer gate pattern.

According to an example, non-limiting embodiment, the method of fabrication may further include forming a threshold voltage controlling impurity region in the semiconductor substrate.

According to an example, non-limiting embodiment, the transfer gate electrode may be a polysilicon film.

BRIEF DESCRIPTION OF THE DRAWINGS

Example, non-limiting embodiments will be described with reference to the accompanying drawings.

DESCRIPTION OF EXAMPLE NON-LIMITING EMBODIMENTS

Figure 1:
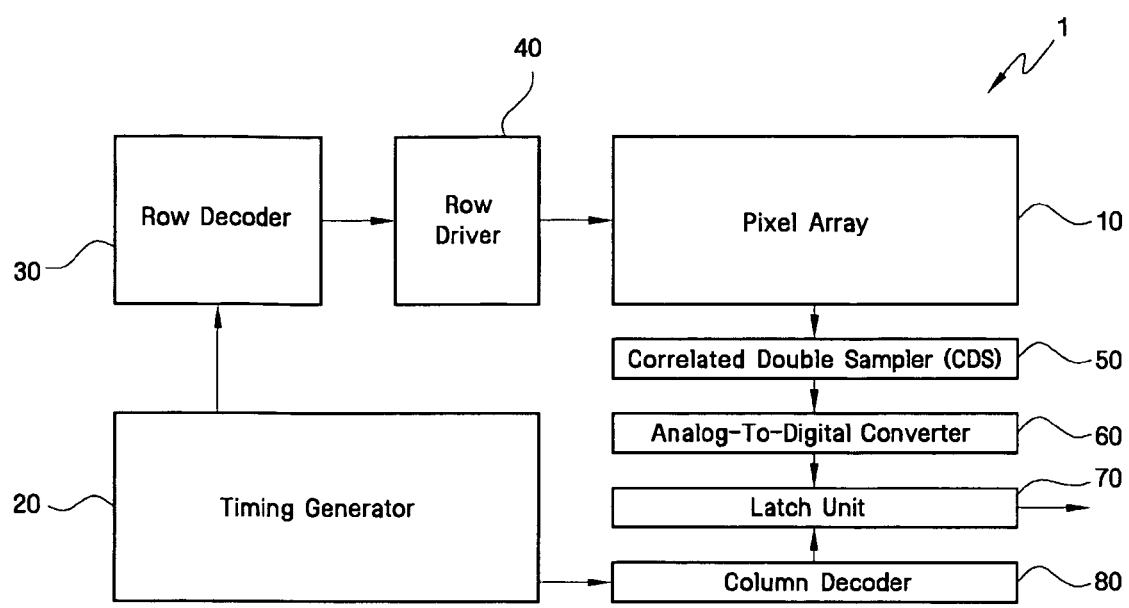
FIG. 1 is a block diagram of an image sensor according to an example, non-limiting embodiment.

Various example, non-limiting embodiments will now be described more fully with reference the accompanying drawings. However, specific structural and functional details disclosed herein are merely representative for purposes of describing example, non-limiting embodiments. Example embodiments may, however, may be in many alternate forms and should not be construed as limited to only the example, non-limiting embodiments set forth herein.

Accordingly, example, non-limiting embodiments are provided so that this disclosure will be thorough and complete, and will fully convey the scope of the present invention to those skilled in the art, and the scope will be defined by the appended claims. Well-known device structures and technologies will not be described in detail in some example embodiments to avoid obscuring the example embodiments. Further, terms like "first conductivity type" and "second conductivity type" indicate conductive types opposite to each other, for example, p-type and n-type, respectively. Each of the example, non-limiting embodiments described and illustrated herein also may include complementary embodiments.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a,", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example, non-limiting embodiments may relate to an image sensor that may include a CCD (charge coupled device) or a CMOS image sensor. For example, a CCD may have lower noise levels and/or better image quality compared to a CMOS image sensor, but may require higher voltage and/or incur higher process costs. A CMOS image sensor may be driven in a simpler and/or easier manner and may be embodied using various scanning methods. Also, a CMOS image sensor may allow for the miniaturization of products because signal processing circuits may be integrated on a single chip, and/or may reduce production costs because CMOS processing technology may be compatibly used. A CMOS image sensor also may have lower power consumption, and thus may be applied to products having limited battery capacity. In example, non-limiting embodiments described herein, the image sensor may be a CMOS image sensor. However, it is to be understood that the technical concept of the example, non-limiting embodiments may also be similarly applied to a CCD.

Hereinafter, an image sensor according to an example, non-limiting embodiment will be described.

FIG. 1 is a block diagram of an image sensor according to an example, non-limiting embodiment.

Referring to FIG. 1, an image sensor 1 may include a pixel array structure 10, a timing generator 20, a row decoder 30, a row driver 40, a correlated double sampler (CDS) 50, an analog-to-digital converter (ADC) 60, a latch structure 70, and/or a column decoder 80.

The pixel array structure 10 may include a plurality of unit pixels that may be arranged in a two-dimensional form. The unit pixels may serve to convert optical images to electrical signals. The pixel array structure 10 may be driven by receiving a plurality of driving signals from the row driver 40, including a pixel selection signal (ROW), a reset signal (RST) and a charge transfer signal (TG). The converted electrical signal may be provided to the correlated double sampler 50 via a vertical signal line.

The timing generator 20 may provide timing and control signals to the row decoder 30 and the column decoder 80.

The row driver 40 may provide a plurality of driving signals to the pixel array structure 10 on the basis of results decoded in the row decoder 30. For example, when the unit pixels are arranged in a matrix form, the driving signals may be provided to each row.

The correlated double sampler 50 may receive the electrical signal formed in the pixel array structure 10 via the vertical signal line and may hold and sample the received electrical signal. For example, the correlated double sampler 50 may doubly sample a given reference voltage level (hereinafter, referred to as a "noise level") and a voltage level caused by the formed electrical signal (hereinafter, referred to as "signal level") and the correlated double sampler 50 may output a difference level corresponding to the difference between the noise level and the signal level.

The analog-to-digital converter 60 may convert an analog signal corresponding to the difference level to a digital signal and may output the converted digital signal.

The latch structure 70 may latch the digital signal, and the latched signal may be sequentially output to an image signal processing section (not shown) on the basis of the result decoded in the column decoder 80.

Figure 2:
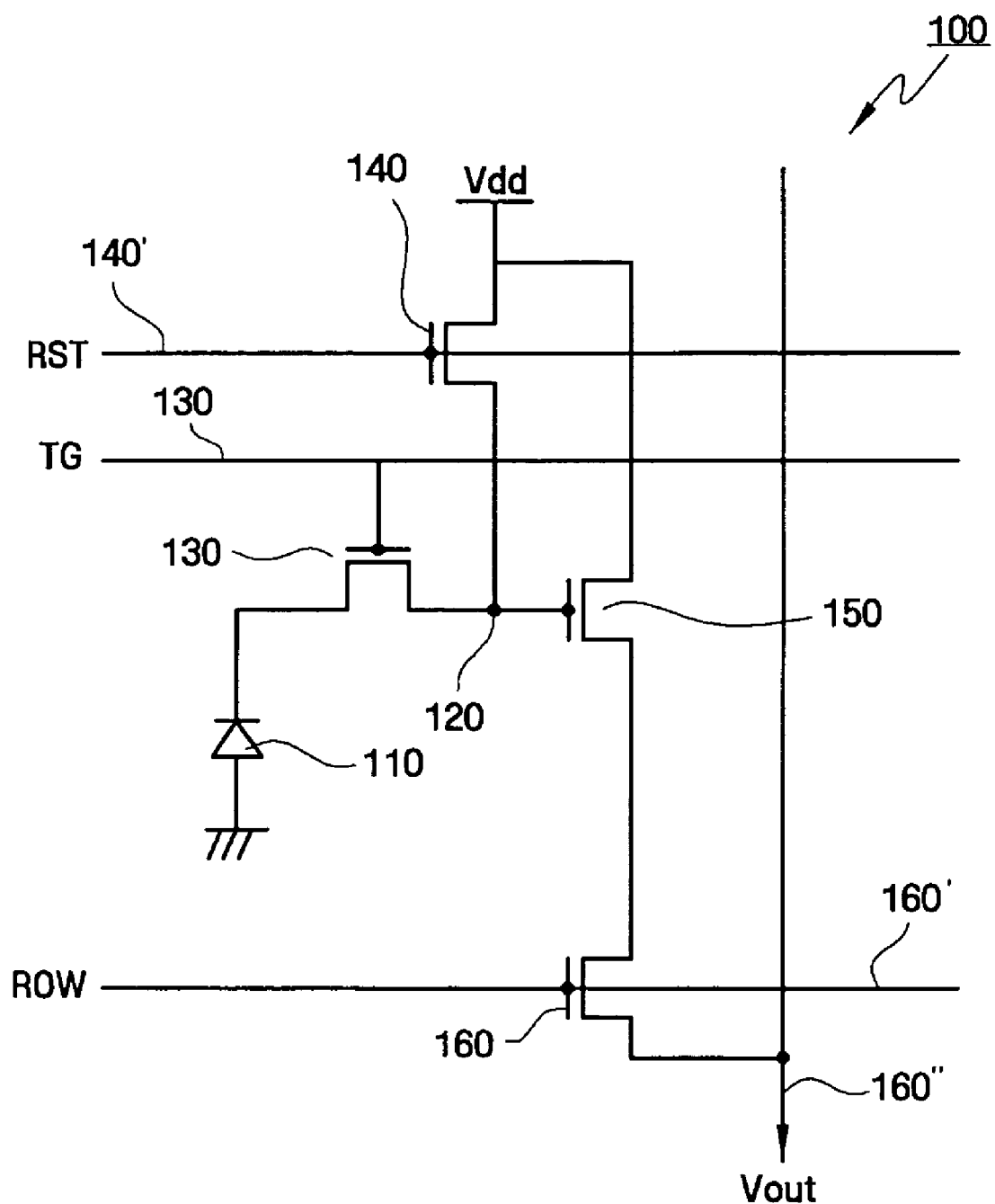
FIG. 2 is a circuit diagram showing a unit pixel of an image sensor according to an example, non-limiting embodiment.
Figure 3:
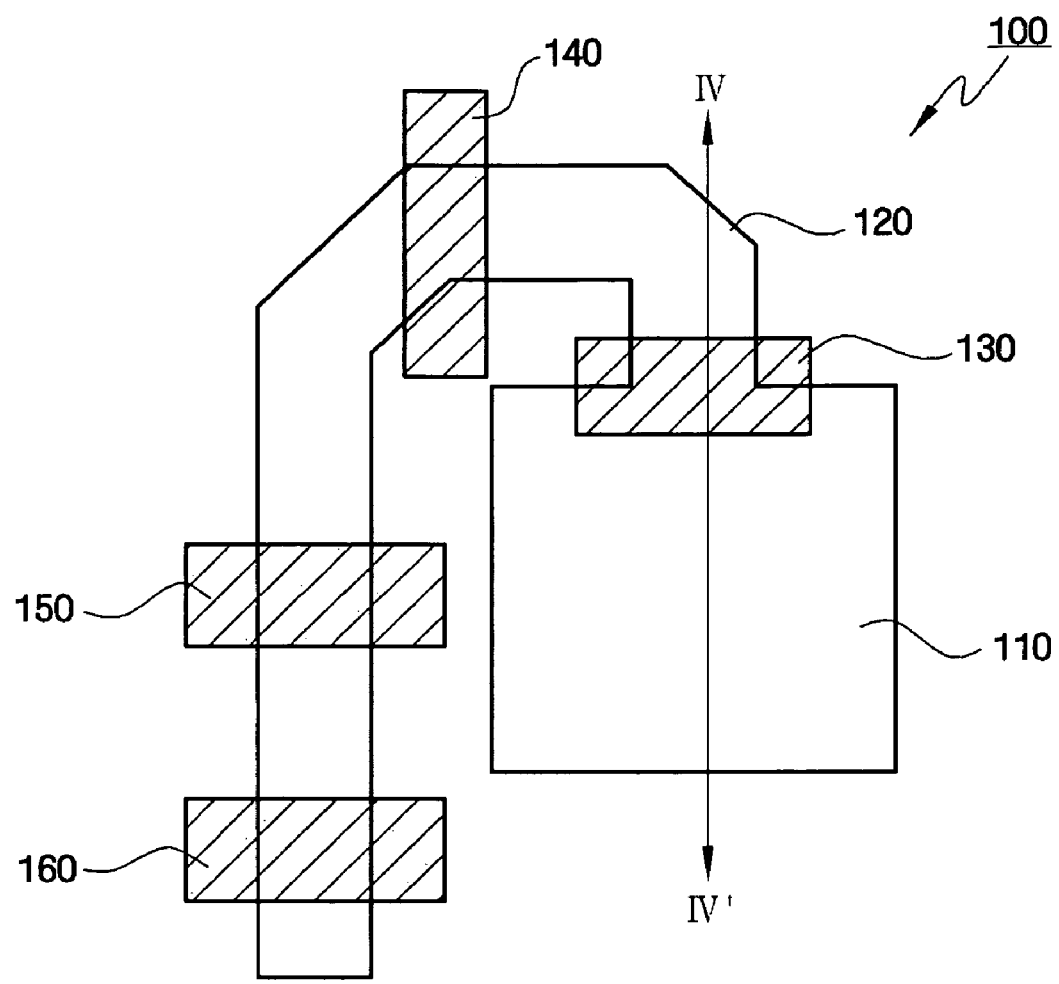
FIG. 3 is a schematic top view showing a unit pixel of an image sensor according to an example, non-limiting embodiment.

FIG. 2 is a circuit diagram showing a unit pixel of an image sensor according to an example, non-limiting embodiment. FIG. 3 is a schematic top view showing a unit pixel of the image sensor according to an example, non-limiting embodiment.

Referring to FIGS. 2 and 3, a unit pixel 100 of an image sensor may include a photoelectric conversion region 110, a charge detection region 120, a charge transfer structure 130, a reset section 140, an amplification section 150 and a selection section 160. Although a unit pixel 100 may be composed of a four-transistor structure as shown in FIG. 2, the unit pixel 100 may, for example, also be composed of a five-transistor structure or another numbered transistor structure.

The photoelectric conversion region 110 may function to absorb incident light and may accumulate charge corresponding to the amount of light. For example, the photoelectric conversion region 110 may be a photodiode, a phototransistor, a photogate, a pinned photodiode (PPD) and/or a combination thereof.

The charge detection region 120 may include a floating diffusion region (FD), and may receive charge accumulated in the photoelectric conversion region 110. The charge detection region 120 may have parasitic capacitance, and the charge may be cumulatively stored therein. The charge detection region 120 may be electrically connected to the gate of the amplification section 150 so as to control the amplification section 150.

The charge transfer structure 130 may transfer the charge from the photoelectric conversion region 110 to the charge detection region 120. For example, the charge transfer structure 130 may include at least one transistor and may be controlled by a charge transfer signal (TG).

The reset section 140 may periodically reset the charge detection region 120. The source of the reset section 140 may be connected to the charge detection region 120, and the drain of the reset section 140 may be connected to Vdd. The reset section 140 may be driven in response to a reset signal (RST).

The amplification section 150 may function as a source follower buffer amplifier in combination with a constant current source located outside the unit pixel 100. Voltage changing in response to the charge detection region 120 may be output to a vertical signal line 160". The source of the amplification section 150 may be connected to the drain of the selection section 160, and the drain of the amplification section 150 may be connected to Vdd.

The selection section 160 may function to select the unit pixel 100 to be read out in a row unit. The selection section 160 may be driven in response to a selection signal (ROW), and the source thereof may be connected to the vertical signal line 160".

Driving signal lines 130', 140' and 160' for driving the charge transfer selection 130, the reset section 140 and the selection section 160 may be extended in a row direction (horizontal direction) such that unit pixels included in the same row may be simultaneously driven.

Figure 4:
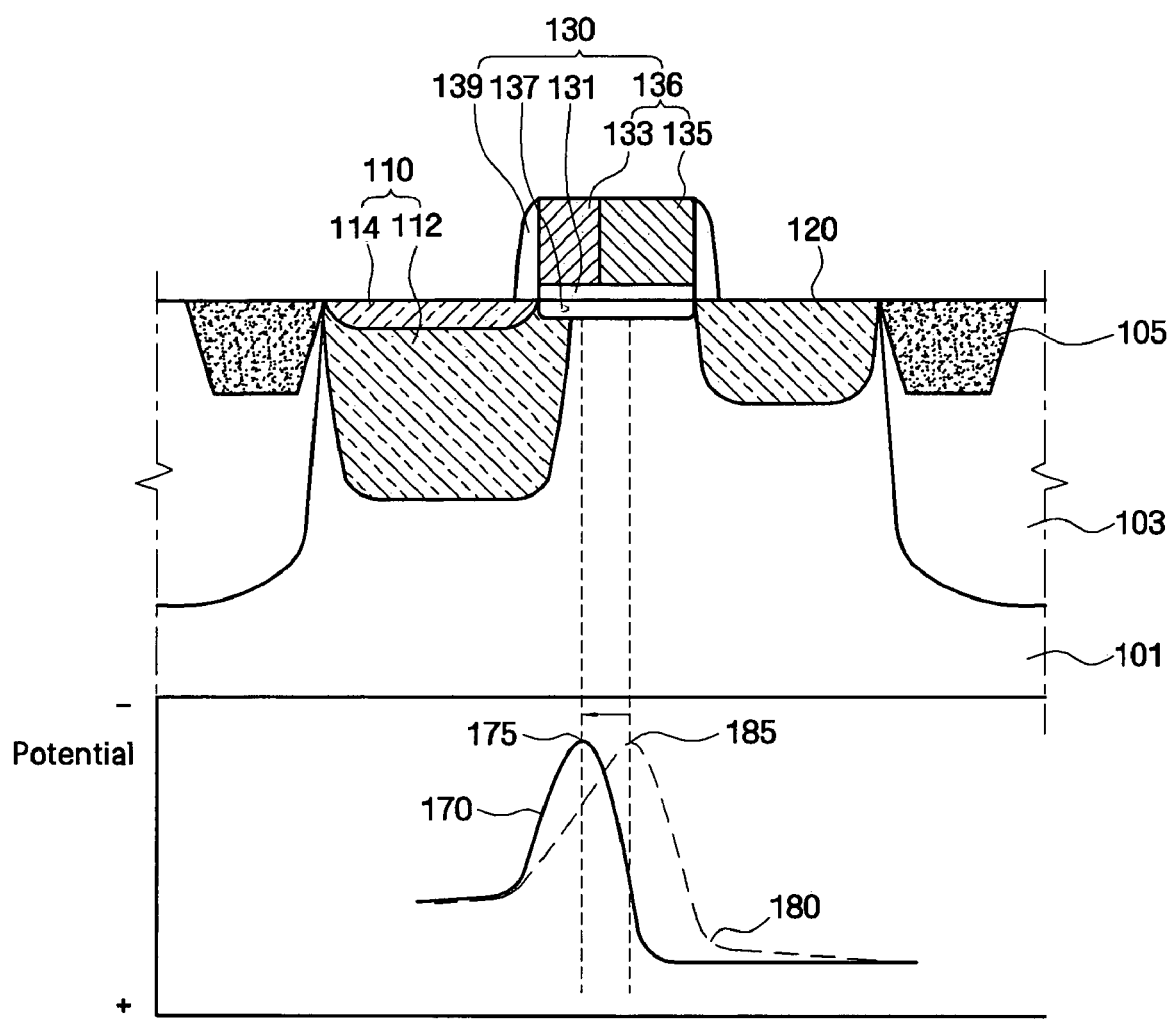
FIG. 4 is an example cross-sectional view of a unit pixel of an image sensor according to the example, non-limiting embodiment of FIG. 3, taken along line IV-IV' (a voltage diagram).

FIG. 4 is a cross-sectional view of the unit pixel of an image sensor according to an example, non-limiting embodiment, taken along line IV-IV' of FIG. 3.

Referring to FIG. 4, an image sensor may include a charge transfer structure 130 formed on a channel region between a photoelectric conversion region 110 and a charge detection region 120 formed in a semiconductor substrate 101.

The semiconductor substrate 101 may be a p-type semiconductor substrate that may have a p-type epitaxial layer grown thereon or a separate well region formed therein, but is not limited thereto. For example, the semiconductor substrate 101 may be provided by forming a p-well at a deep location in an N-type semiconductor substrate and separately forming a p-well where an NMOS transistor may be formed. Some variation is possible within the object and scope of the example embodiments.

An element isolation region 105 may be formed on the semiconductor substrate 101 to define an active region. For example, the element isolation region 105 may be a FOX (field oxide) or STI (shallow trench isolation) type that may be formed using LOCOS (LOCal Oxidation of Silicon).

An isolation well 103 having a first conductivity type (e.g., p-type) may be formed under the element isolation region 105. The isolation well 103 may function to isolate a plurality of photodiodes 112 from each other. For example, the isolation well 103 may be formed deeper than the photodiodes 112 to reduce the horizontal crosstalk between the photodiodes 112, and although not shown in the figure, the isolation well 103 may be formed so as to be connected to a deep well.

The photoelectric conversion region 110 may include a first conductivity type photodiode 112 that may be formed in the semiconductor substrate 101. A first conductivity type pinning layer 114 may be formed on the photodiode 112.

The photodiode 112 may accumulate generated charge corresponding to incident light, and the pinning layer 114 may reduce or prevent dark currents by reducing thermally generated EHPs (electron-hole pairs). For example, the photodiode 112 may be formed at a deeper location in the semiconductor substrate 101 and the pinning layer 114 may be formed thereon. In this way, positive charge among EHPs thermally generated on the surface of the substrate 101 (e.g., the surface of the photodiode 112) may be diffused to the grounded substrate through the P⁺ type pinning layer 114, and negative charge may disappear by recombining with the positive charge in a process of diffusing the pinning layer 114.

The doping concentration and location of each of the photodiode 112 and the pinning layer 114 may vary depending on the fabrication process and design.

The photodiode 112 in the photoelectric conversion region 110 may be formed such that the photodiode 112 partially overlaps a transfer gate electrode 136. The charge that may be accumulated in the photodiode 112 may be transferred to charge detection region 120 through a channel region that may be formed under a charge transfer structure 130 (e.g., a transfer gate electrode 136). For example, the photodiode 112 may be formed deeper than the channel region formed below the transfer gate electrode 136. If the gate electrode 136 is turned on, the charge accumulated in the photodiode 112 may first move upward a given distance to reach the channel region. If the photodiode 112 partially overlaps the gate electrode 136, as described above, the moving distance of the charge may be reduced so that the charge may be transferred to the charge detection region 120 in a shorter time.

The charge detection region 120 may be formed in the semiconductor substrate 101 so that the charge detection region 120 may receive the charge accumulated in the photoelectric conversion region 110 via the charge transfer structure 130. The doping concentration and location of the charge detection region 120 may vary depending on the fabrication process and design.

The charge transfer structure 130 may be formed on a channel region between the photoelectric conversion region 110 and the charge detection region 120, and may include a gate insulating film 131 and a transfer gate electrode 136.

For example, the gate insulating film 131 may be composed of SiO$_2$, SiON, SiN, Al$_2$O$_3$, Si$_3$N$_4$, Ge$_x$O$_y$N$_z$, Ge$_x$Si$_y$O$_z$, or a high dielectric material. The high dielectric material, for example, may be composed of HfO$_2$, ZrO$_2$, Al$_2$O$_3$, Ta$_2$O$_5$, hafnium silicate, zirconium silicate or a combination thereof, and may be deposited, for example, by atomic layer deposition. Alternatively, the gate insulating film 131 may be formed by depositing at least two materials selected from among the example films described above to form a plurality of layers.

In the transfer gate electrode 136 that may formed on the gate insulating film 131, regions doped with impurities having different conductivity types may be formed adjacent to each other. For example, the transfer gate electrode 136 may include a polysilicon film having a region 133 doped with a first conductivity type impurity and a region 135 doped with a second conductivity type impurity. For example, the first conductivity type impurity-doped region 133 and the second conductivity type impurity-doped region 135 may be formed transversely adjacent to each other. The first conductivity type impurity region and the second conductivity type impurity region may formed to be touching, but are not necessarily limited thereto.

The first conductivity type impurity-doped region 133 may be formed adjacent to the photoelectric conversion region 110, and the second conductivity type-doped region 135 may be formed adjacent to the charge detection region 120. The photodiode 112 of the photoelectric conversion region 110 and the charge detection region 120 may be a second conductivity type, and the pinning layer 114 may be a first conductivity type. The second conductivity type impurity-doped region 135 may be formed to be wider than the first conductivity type impurity-doped region 133. For example, the second conductivity type impurity-doped region 135 may be formed to a width that is more than about 50% of the overall width of the transfer gate electrode 136.

By way of example only, the peak impurity concentration of the first conductivity type impurity-doped region 133 may be in a range of about $1 \times 10^{16}$ to $1 \times 10^{20}$ atoms/cm$^3$, and the peak impurity concentration of the second conductivity type impurity-doped region 135 may be in a range of about $1 \times 10^{17}$ to $1 \times 10^{21}$ atoms/cm$^3$. However, the impurity concentrations are not limited thereto, because the doping concentration and location may vary depending on the fabrication process and design.

As described above, the charge transfer structure 130 may include a transfer gate electrode 136 that may be made of a polysilicon film and may include regions doped with different conductivity type impurities. This type of transfer gate electrode may influence a potential barrier that may be formed below the transfer gate electrode. For example, an n-type region may function to lower the potential barrier, whereas a p-type region may function to increase the potential barrier. Because the transfer gate electrode 136 may include regions doped with different conductivity type impurities, which may be formed transversely adjacent to each other, the difference in work function in the transfer gate electrode 136 may influence the potential barrier formed below the transfer gate electrode 136. Accordingly, the location of a potential barrier peak may be changed.

Referring to the electrostatic potential view shown in the lower portion of FIG. 4, the potential barrier peak 175, shown as a solid line 170, may be formed closer to the photoelectric conversion region 110 than the charge detection region 120, compared to a prior potential barrier, shown as a dotted line 180, by adjusting, for example, the relative ratio between the first conductivity type impurity-doped region 133 and the second conductivity type impurity-doped region 135. Thus, for example, thermally generated charge that may be formed below the transfer gate electrode in the semiconductor substrate may not be introduced into the photoelectric conversion region 110, but rather they may flow toward the charge detection region 120, due to the changed potential barrier peak 175. This may reduce or prevent deterioration in image reproduction characteristics, for example, the occurrence of white spots or dark currents in the image sensor, which may be caused by the introduction of thermally generated charges.

The charge transfer structure 130 may include a threshold voltage controlling impurity region 137 in the channel region below the transfer gate electrode 136 in the substrate 101. Although not shown in the figures, the threshold voltage controlling impurity region 137 may be composed of a first conductivity type or second conductivity type impurity region or may include both a first conductivity type impurity region and a second conductivity type impurity region. The second conductivity type impurity region in the threshold voltage controlling impurity region 137 may form the channel region in the charge transfer structure 130, and the first conductivity type impurity region may reduce or prevent dark currents by grounding a surface when the charge transfer structure 130 is turned off.

The charge transfer structure 130 may further include a spacer 139 surrounding the sidewall of the transfer gate electrode 136.

Although example, non-limiting embodiments illustrated with reference to FIGS. 1 to 4 may include a charge transfer structure 130, a charge detection region 120, a reset section 140, a selection section 160 and an amplification section 150 for each of the photoelectric conversion regions 110, it is to be understood that example embodiments may also include an image sensor in which at least two photoelectric conversion regions 110 may share a charge transfer structure 130, a charge detection region 120, a reset section 140, a selection section 160 and/or an amplification section 150, for example, a 2-shared or 4-shared image sensor.

FIGS. 5 to 10 are cross-sectional views sequentially showing a method of fabricating an image sensor according to an example, non-limiting embodiment. In the following description of the fabrication method, operations commonly known to those skilled in the art will be described only briefly, in order to avoid obscuring example embodiments. Also, the fabrication method disclosed below relates to a method of fabricating an image sensor according to the above-described example embodiments, and the content described for each element of the above-described example embodiments may be applied to the fabrication method in substantially the same manner as above. Thus, these elements will be described in brief or omitted herein.

Figure 5:
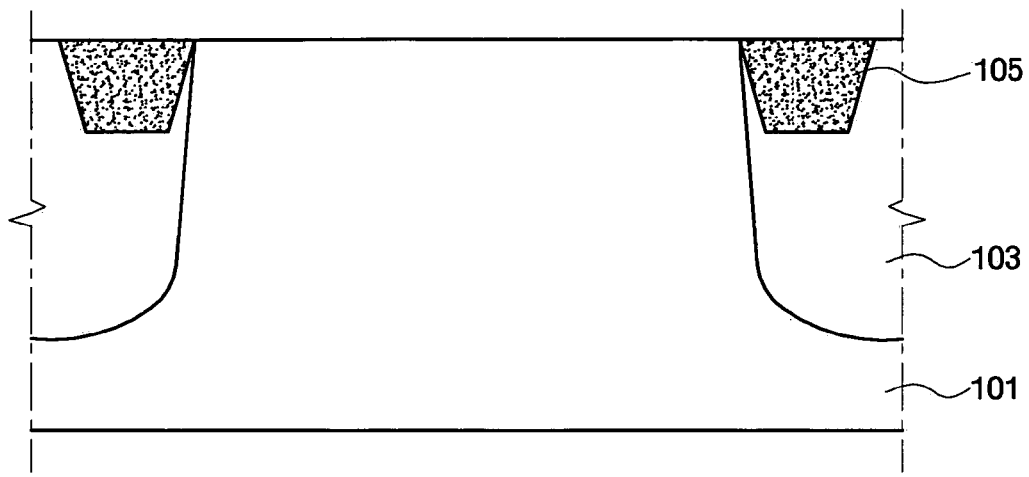
FIGS. 5 to 10 are example cross-sectional views sequentially showing a method of fabricating an image sensor according to an example, non-limiting embodiment.

Referring to FIG. 5, a semiconductor substrate 101 may be provided. An element isolation region 105 that may define an active region may be formed in the semiconductor substrate 101. An isolation well 103 may be formed below the element isolation region 105 that may reduce the crosstalk between pixels.

Figure 6:
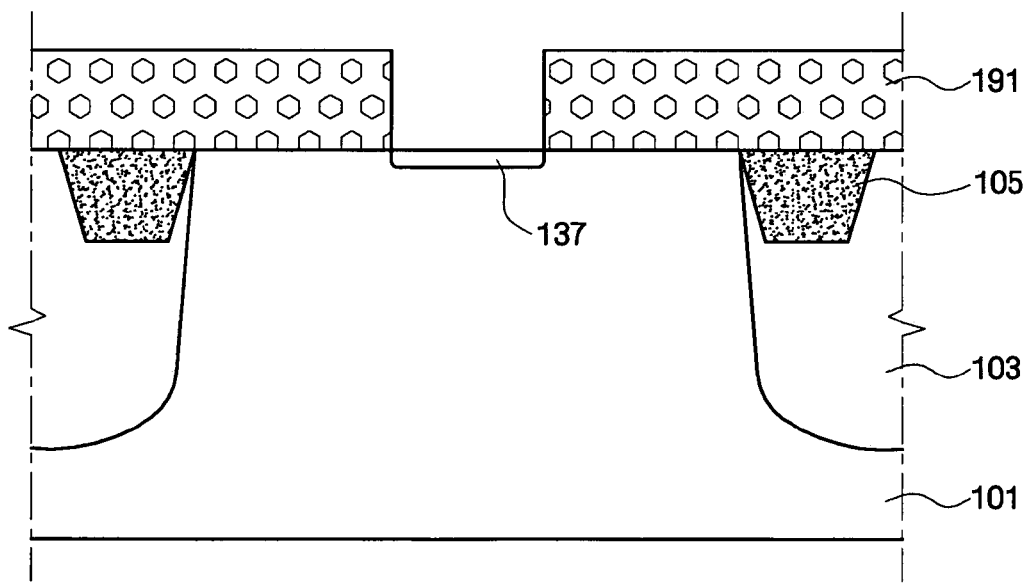

Referring to FIG. 6, a threshold voltage controlling impurity region 137 may be formed in the semiconductor substrate at a region where the transfer gate electrode may be formed. The threshold voltage controlling impurity region 137 may be formed using a first mask pattern 191 that may expose only the region to be implanted with ions.

Although not shown in the figures, the threshold voltage controlling impurity region 137 may be composed of a first conductivity type or second conductivity type impurity region or may also include both the first conductivity type impurity region and the second conductivity impurity region. For example, a threshold voltage controlling impurity region 137 having a first conductivity type impurity region formed on a second conductivity type impurity region may be formed by implanting a second conductivity type impurity into the semiconductor substrate 101 and implanting a first conductivity type impurity therein, but is not limited thereto. The second conductivity type impurity region may form the channel region of the charge transfer structure 130, and the first conductivity type impurity region may reduce or prevent dark currents by grounding a surface when the charge transfer structure 130 is turned off.

Figure 7:
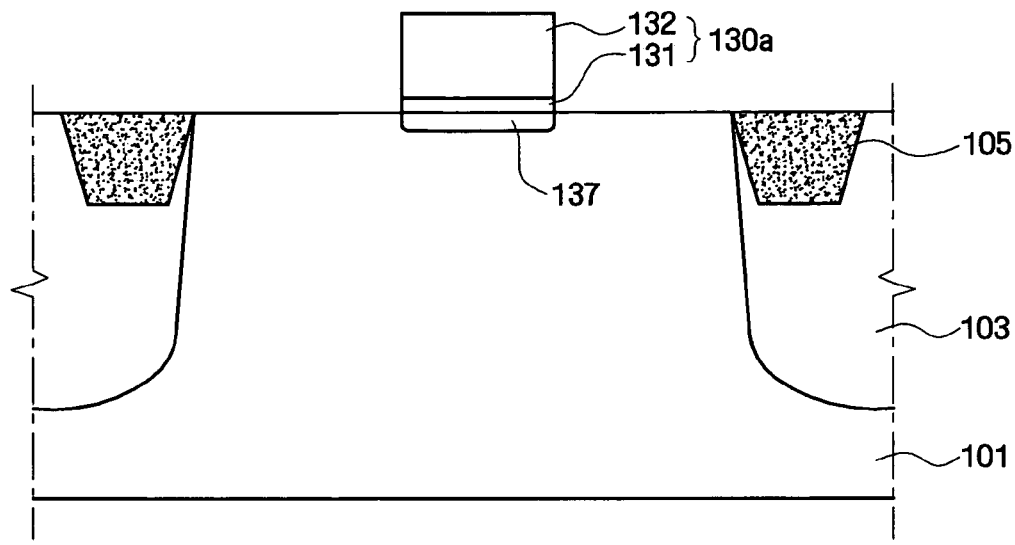

Referring to FIG. 7, a transfer gate pattern 130a may include a gate insulating film 131 and an undoped polysilicon 132 formed thereon. For example, the gate insulating film 131 may be formed on the semiconductor substrate 101, an undoped polysilicon film 132 may be deposited thereon, for example by a CVD process, and the undoped polysilicon film 132 and the gate insulating film 131 may be sequentially patterned.

Figure 8:
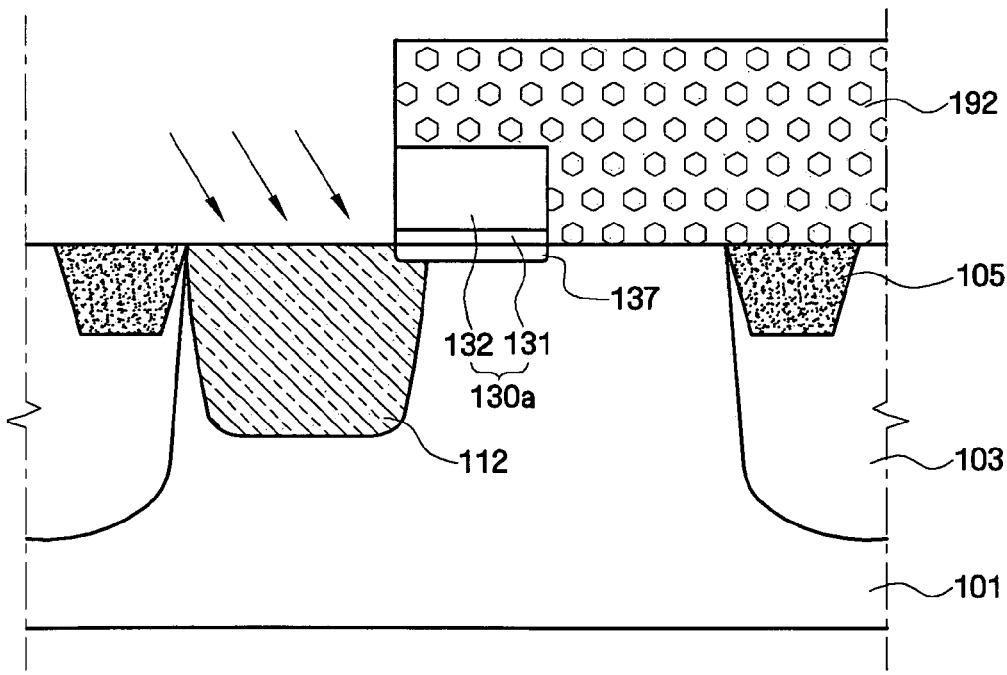

Referring to FIG. 8, a photodiode 112 may be formed in the semiconductor substrate 101 adjacent to one side of the transfer gate pattern 130a. For example, the photodiode 112 may be formed by implanting a second conductivity type impurity. The photodiode 112 may be formed using an ion implantation process wherein ions of the same conductivity type as the impurity to be implanted into the charge detection region 120 to be formed around the photodiode 112 may be implanted deeper than the charge detection region 120 in high energy at a tilt angle of, for example, 0° to about 15°. In this way, the photodiode 112 may be formed so that it may partially overlap the transfer gate pattern 130a A second mask pattern 192 may be formed on the undoped polysilicon film 132 such that ions may not be implanted into the polysilicon film 132, and ion implantation for forming the photodiode 112 may be performed. Although FIG. 8 shows that the second mask pattern 192 may abut one side of the transfer gate pattern 130a, it is to be understood that the second mask pattern 192 may be formed on the transfer gate pattern 130a so as to have a process margin within a range that may not hinder the effects of example embodiments.

Figure 9:
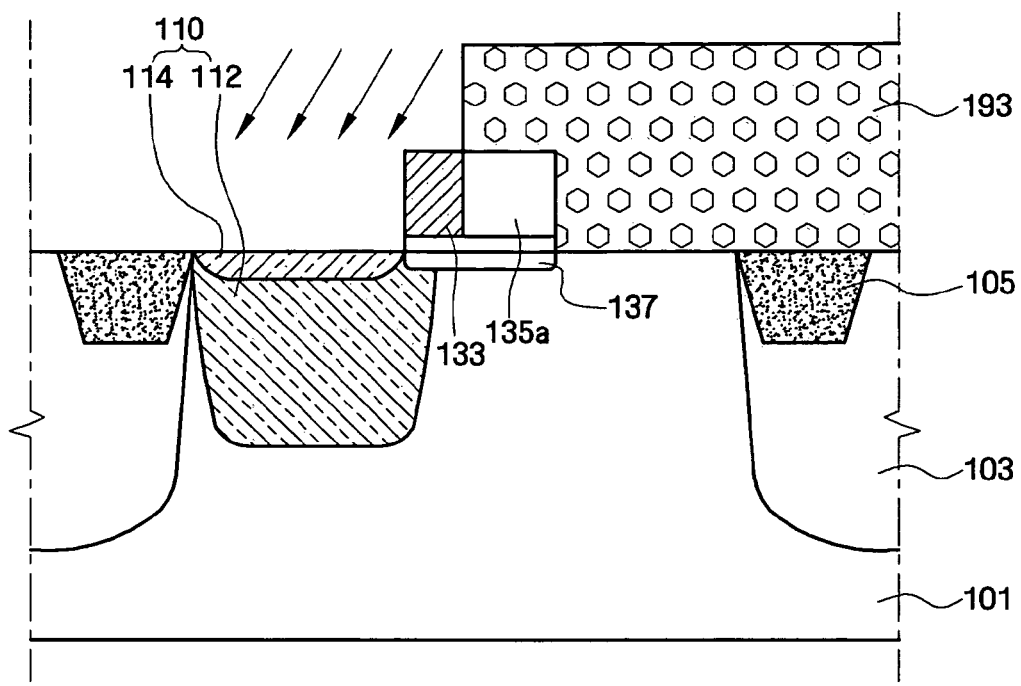

Referring to FIG. 9, a pinning layer 114 may be formed on the photodiode 112 through additional ion implantation. The pinning layer 114 may be formed by implanting an impurity having a conductivity type different from that of the photodiode 112, for example, a first conductivity type impurity, at lower energy and/or at a higher dose. The pinning layer 114 may be formed by implanting ions at a tilt angle of more than 0° in the direction of the element isolation region 105.

A portion of the undoped polysilicon film 132 of the formed transfer gate pattern 130a (e.g., the region of the undoped polysilicon film 132 adjacent to the photoelectric conversion region 110) may be doped with an impurity of a conductivity type equal to the impurity doped into the pinning layer 114, for example, a first conductivity type impurity, during a process of forming the pinning layer 114. For example, a third mask pattern 193 may be formed that may expose a portion of the undoped polysilicon film 132 and ion implantation may be performed to form the pinning layer 114.

The second mask pattern 192 and the third mask pattern 193 may be formed in separate processes, or may be the same mask pattern.

Figure 10:
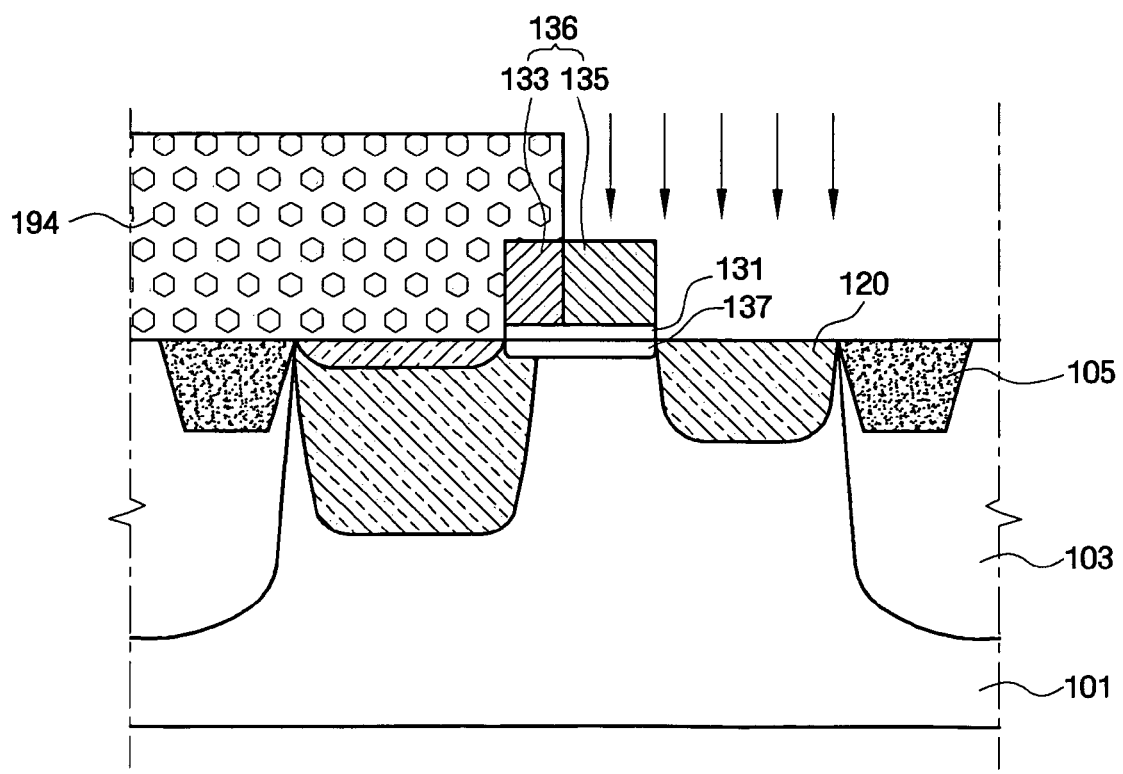

Referring to FIG. 10, a charge detection region 120 may be formed. The charge detection region 120 may be doped with an impurity of the same conductivity type as that of the photoelectric conversion region 110, for example, a second conductivity type impurity.

During the ion implantation for forming the charge detection region 110, the remainder of the undoped polysilicon film 132 of the previously formed transfer gate pattern 130a (e.g., a region 135a not doped with the first conductivity type impurity) may be doped with a second conductivity type impurity. The remainder of the undoped polysilicon film 132 may be the region adjacent to the charge detection region 120 that may be subsequently formed. For example, a fourth mask pattern 194 may be formed that may expose the remainder of the undoped polysilicon film 132 upon the formation of the charge detection region 120, and may be followed by ion implantation. Although the fourth mask pattern 194 may abut the first conductivity type impurity-doped region 133, the fourth mask pattern 194 may be formed to have a process margin within a range that may not damage the effects of example embodiments.

The transfer gate electrode 136 may be made of the impurity-doped polysilicon film which may include both the first conductivity type impurity-doped region 133 and the second conductivity type impurity-doped region 135, which may be transversely adjacent to each other, and the charge transfer structure 130 may thus be completed.

A spacer 139 (shown in FIG. 4) composed of a silicon nitride film may surround the transfer gate electrode may additionally be formed.

A method of fabricating the image sensor according to example, non-limiting embodiments, for example, may simplify the fabrication process because ion implantation for forming the transfer gate electrode may be performed at the same time as the forming of the pinning layer and charge detection layer of the photoelectric conversion region.

An image sensor according to example, non-limiting embodiments may include a transfer gate electrode in which regions doped with impurities having different conductivity types may be formed together. Thus, the potential barrier peak of the charge transfer structure may be formed closer to the photoelectric conversion region than the charge detection region, and the amount of thermally generated charged introduced into the photoelectric conversion region may be reduced. For example, this may lead to improvement of the image reproduction characteristics of the image sensor, for example, reduction of white spots and/or dark currents.

Although example, non-limiting embodiments have been described with reference to the accompanying drawings, it will be appreciated to those of ordinary skill in the art that example embodiments can be embodied in other specific forms without departing from the spirit or essential character thereof. The presently disclosed example, non-limiting embodiments are therefore considered in all respects to be illustrative rather than restrictive.

What is claimed is:

1. An image sensor comprising:
    a semiconductor substrate; and
    a charge transfer structure formed on the semiconductor substrate including
    a gate insulating film formed on a channel region in the semiconductor substrate between a photoelectric conversion region and a charge detection region, and
    a transfer gate electrode formed on the gate insulating film consisting of a first conductivity type impurity-doped region and a second conductivity type impurity-doped region adjacent to each other,
    wherein each of the first conductivity type impurity-doped region and the second conductivity type impurity-doped region consists of a single region doped at a same concentration, and
    wherein a peak of a potential barrier formed below the transfer gate electrode is closer to the photoelectric conversion region than the charge detection region.

2. The image sensor of claim 1, wherein the first conductivity type impurity-doped region is adjacent to the photoelectric conversion region, and the second conductivity type impurity-doped region is adjacent to the charge detection region.

3. The image sensor of claim 1, wherein the first conductivity type impurity-doped region is a p-type region, and the second conductivity type impurity-doped region is an n-type region.

4. The image sensor of claim 1, wherein the second conductivity type impurity-doped region is formed on at least 50% of a width of the transfer gate electrode.

5. The image sensor of claim 1, wherein the photoelectric conversion region is a photodiode having a second conductivity type partially overlapping the transfer gate electrode.

6. The image sensor of claim 5, wherein the photoelectric conversion region further includes a pinning layer having a first conductivity type on the photodiode.

7. The image sensor of claim 1, wherein the charge detection region has a second conductivity type.

8. The image sensor of claim 1, wherein the channel region is a threshold voltage controlling impurity region.

9. The image sensor of claim 1, wherein the charge transfer structure transfers a charge accumulated in the photoelectric conversion region to the charge detection region.

10. The image sensor of claim 1, wherein the transfer gate electrode is formed from a polysilicon film.

11. A method of fabricating an image sensor, comprising:
    providing a semiconductor substrate; and
    forming a charge transfer structure on the semiconductor substrate including
    forming a gate insulating film on a channel region in the semiconductor substrate between a photoelectric conversion region and a charge detection region, and
    forming a transfer gate electrode on the gate insulating film consisting of a first conductivity type impurity-doped region and a second conductivity type impurity-doped region adjacent to each other,
    wherein each of the first conductivity type impurity-doped region and the second conductivity type impurity-doped region consists of a singe region doped at a same concentration, and
    wherein forming the transfer gate electrode includes forming the first conductivity type impurity-doped region and the second conductivity type impurity-doped region in the transfer gate electrode such that a peak of a potential barrier formed below the transfer gate electrode is closer to the photoelectric conversion region than the charge detection region.

12. The method of claim 11, wherein forming the transfer gate electrode includes forming the first conductivity type impurity-doped region adjacent to the photoelectric conversion region, and forming the second conductivity type impurity-doped region adjacent to the charge detection region.

13. The method of claim 11, wherein the first conductivity type impurity-doped region is a p-type region, and the second conductivity type impurity-doped region is an n-type region.

14. The method of claim 11, wherein forming the transfer gate electrode includes forming the second conductivity type impurity-doped region on at least 50% of a width of the transfer gate electrode.

15. The method of claim 11, wherein forming the charge transfer structure includes
    forming a transfer gate pattern on the gate insulating film;
    implanting a second conductivity type impurity into the semiconductor substrate adjacent to a first side of the transfer gate pattern to form a second conductivity type photodiode partially overlapping the transfer gate pattern;
    forming a first conductivity type pinning layer on the second conductivity type photodiode concurrently with the forming of the first conductivity type impurity-doped region on the transfer gate pattern; and
    implanting the second conductivity type impurity into the semiconductor substrate adjacent to a second side of the transfer gate pattern to form the charge detection region concurrently with the forming of the second conductivity type impurity-doped region on the transfer gate pattern.

16. The method of claim 11, further comprising forming a threshold voltage controlling impurity region in the channel region of the semiconductor substrate.

17. The method of claim 11, wherein the transfer gate electrode is formed from a polysilicon film.

* * * * *